(12) United States Patent
Brown et al.

(10) Patent No.: US 10,184,839 B1
(45) Date of Patent: Jan. 22, 2019

(54) NANOSTRUCTURED VANADIUM OXIDE UNCOOLED BOLOMETERS AND METHOD OF FABRICATION

(71) Applicant: The United States of America as represented by the Administrator of NASA, Washington, DC (US)

(72) Inventors: Ari D. Brown, Ellicott City, MD (US); Emily M. Barrentine, Washington, DC (US); Shahid Aslam, Washington, DC (US)

(73) Assignee: The United States of America as represented by the Administrator of NASA, Washington, DC (US)

( * ) Notice: Subject to any disclaimer, the term of this patent is extended or adjusted under 35 U.S.C. 154(b) by 0 days.

(21) Appl. No.: 15/691,109

(22) Filed: Aug. 30, 2017

(51) Int. Cl.
| | |
|---|---|
| *G01J 5/20* | (2006.01) |
| *C23C 14/08* | (2006.01) |
| *C23C 14/58* | (2006.01) |
| *C23C 14/34* | (2006.01) |
| *C23C 14/00* | (2006.01) |
| *C23C 14/16* | (2006.01) |
| *C23C 14/35* | (2006.01) |

(52) U.S. Cl.
CPC ............ *G01J 5/20* (2013.01); *C23C 14/0036* (2013.01); *C23C 14/083* (2013.01); *C23C 14/165* (2013.01); *C23C 14/3464* (2013.01); *C23C 14/35* (2013.01); *C23C 14/5826* (2013.01); *C23C 14/5873* (2013.01)

(58) Field of Classification Search
CPC ...... G01J 5/20; C23C 14/0036; C23C 14/083; C23C 14/165; C23C 14/3464; C23C 14/35; C23C 14/5826; C23C 14/5873
See application file for complete search history.

(56) References Cited

U.S. PATENT DOCUMENTS

| | | | | | |
|---|---|---|---|---|---|
| 5,801,383 | A | * | 9/1998 | Wada | G01J 5/20 250/332 |
| 5,854,587 | A | * | 12/1998 | Horwitz | G01J 5/20 338/225 D |
| 8,329,002 | B1 | * | 12/2012 | Githinji | C23C 14/0042 204/192.21 |
| 2002/0190210 | A1 | * | 12/2002 | Ishikawa | G01J 5/08 250/338.4 |
| 2003/0025079 | A1 | * | 2/2003 | Yoshitake | G01J 5/20 250/338.1 |
| 2003/0062480 | A1 | * | 4/2003 | Kanzaki | B81B 7/0041 250/338.1 |
| 2003/0098445 | A1 | * | 5/2003 | Higuma | G01J 5/20 252/500 |
| 2004/0089807 | A1 | * | 5/2004 | Wada | G01J 5/20 250/338.1 |
| 2005/0254994 | A1 | * | 11/2005 | Bell | G01K 7/30 422/51 |

(Continued)

*Primary Examiner* — Marcus Taningco
(74) *Attorney, Agent, or Firm* — Christopher O. Edwards; Bryan A. Geurts; Mark P. Dvorscak

(57) ABSTRACT

The present invention relates to uncooled microbolometers which can be integrated in future thermal instruments engaged in land imaging on future observatories. The present invention includes: (1) developing and characterizing a microstructured VOx thin film, and, (2) fabricating an uncooled microbolometer array over the 8-14 micron spectral band.

16 Claims, 1 Drawing Sheet

(56) References Cited

U.S. PATENT DOCUMENTS

2012/0181500 A1\* 7/2012 Tsuji ................ H01L 45/04
257/4
2016/0032443 A1\* 2/2016 Gu .................. C23C 14/5853
428/432

\* cited by examiner

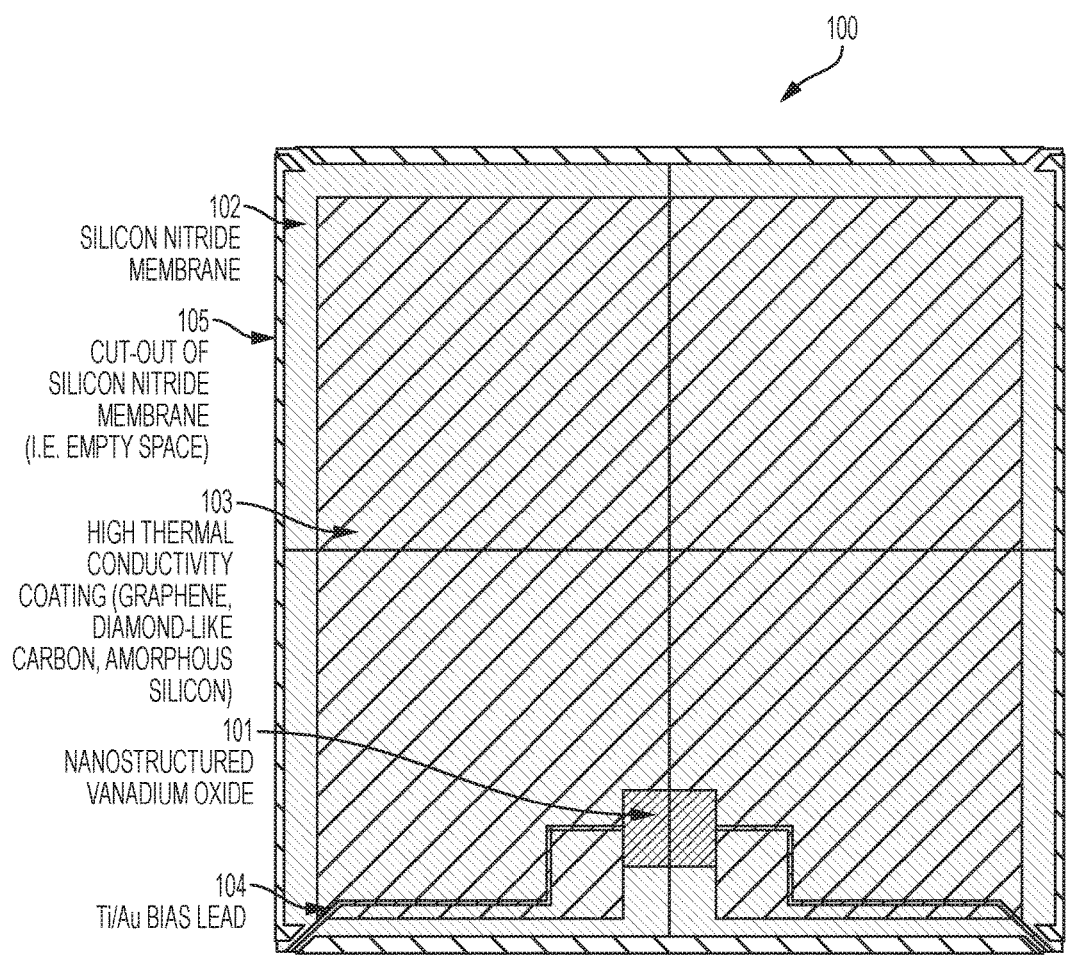

NANOSTRUCTURED VANADIUM OXIDE UNCOOLED BOLOMETERS AND METHOD OF FABRICATION

ORIGIN OF THE INVENTION

The invention described herein was made by an employee of the United States Government, and may be manufactured or used by or for the Government for governmental purposes without the payment of any royalties thereon or therefor.

BACKGROUND OF THE INVENTION

1. Field of the Invention

The present invention relates to a nanostructured, vanadium oxide ($VO_x$) coating which is incorporated as the sensing element of thermal instruments, such as uncooled microbolometers, engaged in applications such as sustainable land imaging by observatories. The present invention is directed to fabricating the $VO_x$ thin film bolometer, including: (1) depositing a vanadium oxide ($VO_x$) thin film on a silicon nitride substrate, and developing and characterizing the microstructured thin film, and (2) fabricating thermal instrument mechanical models, such as an uncooled microbolometer array, over ultrathin silicon nitride membranes (i.e., over the 8-14 micron spectral band).

2. Description of the Related Art

A microbolometer is an uncooled thermal sensor used as a detector in a thermal camera, which includes an array of pixels made up of several layers. Infrared radiation strikes an absorber material, typically in the form of an impedance matched coating, or a meta-material absorptive coating, and heats it. The detector material, which is thermally well coupled to the absorber is heated, which results in a change of its electrical resistance. This change is measured and processed into temperatures which can be used to create a thermal image.

One problem with existing, commercial microbolometers, is that their specific detectivity divided by time constant, D*/t, is too low for applications such as thermal land imaging instruments.

Thus, the fabrication of a $VO_x$ thin film with a thermal coefficient of resistance (TCR) that is at least three times higher than that used in conventional commercial off-the-shelf (COTS) microbolometers, i.e., from a value~−2.0/K % in standard films to ~−6.5/K %, is desired.

SUMMARY OF THE INVENTION

The present invention relates to a nanostructured, vanadium oxide ($VO_x$) coating which is incorporated as the sensing element of thermal instruments, such as uncooled microbolometers, engaged in applications such as sustainable land imaging by observatories.

The present invention relates to a method of fabricating a bolomoter, including: sputter-depositing a vanadium oxide film on a silicon substrate inside a deposition chamber; wherein a composition of the vanadium oxide film is varied by changing an oxygen partial pressure inside the deposition chamber; and wherein a microstructure of the vanadium oxide film is varied by at least one of applying a reverse bias during deposition, and heating the silicon substrate during deposition, and/or heating the silicon substrate post-deposition in an oxygen-rich environment; wherein a change in the microstructure increases a temperature coefficient of resistance (TCR) of the vanadium oxide film.

In one embodiment, the silicon substrate is coated with one of a film of silicon nitride or silicon dioxide.

In one embodiment, the sputter deposition is carried out inside the deposition chamber of one of an ultrahigh vacuum, magnetron or radio frequency (RF) sputtering deposition system.

In one embodiment, the deposition with a relatively higher oxygen partial pressure resulted in insulating films; and the deposition with a relatively lower oxygen partial pressure and a reverse bias etching resulting in semi-metallic films.

In one embodiment, the vanadium oxide film has a temperature coefficient of resistance (TCR) exceeding 6.5/K %.

In one embodiment, the method further includes: reducing an internal thermal time constant by depositing a thermally conductive film on the silicon nitride or silicon dioxide coated vanadium oxide film with of one of amorphous silicon, graphene, or diamond-like carbon.

In one embodiment, the method further includes: sputter-depositing a plurality of titanium/gold bias leads and bond pads on the vanadium oxide thin film, patterning the plurality of titanium/gold bias leads and bond pads using a lift-off photo-resist mask, and etching a plurality of silicon nitride thermal isolation legs in the vanadium oxide film and the silicon substrate.

In one embodiment, the method further includes: thinning the silicon substrate from a back side of the substrate using a deep reactive ion etcher, after which the photo-resist mask is dissolved.

In one embodiment, etching of the thermal isolation legs is performed from a front of the silicon substrate, using a reactive ion etch process.

In one embodiment, the vanadium oxide film is a sensing element of the bolometer, and is used in thermal imaging applications over the 8-14 micron spectral band.

In one embodiment, a bolomoter includes: a vanadium oxide film sputter-deposited on a silicon substrate inside a deposition chamber; wherein a composition of the vanadium oxide film is varied by changing an oxygen partial pressure inside the deposition chamber; and wherein a microstructure of the vanadium oxide film is varied by at least one of applying a reverse bias during deposition, and heating the silicon substrate during deposition, and/or heating the silicon substrate post-deposition in an oxygen-rich environment; wherein a change in the microstructure increases a temperature coefficient of resistance (TCR) of the vanadium oxide film.

In one embodiment, the bolometer further includes: a plurality of titanium/gold bias leads and bond pads deposited on the vanadium oxide thin film; and a plurality of silicon nitride thermal isolation legs etched in the vanadium oxide film and the silicon substrate; wherein the plurality of titanium/gold bias leads and bond pads are patterned using a lift-off photo-resist mask.

Thus, has been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWINGS

The FIGURE shows a schematic drawing of an uncooled bolometer, according to one embodiment consistent with the present invention.

DESCRIPTION OF THE INVENTION

The present invention relates to a nanostructured, vanadium oxide ($VO_x$) coating which is incorporated as the sensing element of thermal instruments, such as uncooled microbolometers, engaged in applications such as sustainable land imaging by observatories.

In one exemplary embodiment, uncooled vanadium oxide ($VO_x$) coatings are manufactured as a viable option for thermal imaging instruments, to increase the temperature coefficient of resistance (TCR) of the $VO_x$ thermistor. Another exemplary embodiment would entail reducing the internal thermal time constant by depositing a thin, thermally conductive thin film on the membrane containing the VOx like amorphous silicon (Si), graphene, or diamond-like carbon. The TCR of $VO_x$ could be increased to a value of 6.5/K % using ion beam sputtering and post-annealing. Ion beam sputtering is a highly specialized deposition technique, which is available in very few laboratory facilities.

Thus, the present invention is directed to the fabrication of a $VO_x$ thin film with a thermal coefficient of resistance (TCR) that is at least three times higher than that used in conventional commercial off-the-shelf (COTS) microbolometers, i.e., from a value~-2.0/K % in standard films to ~-6.5/K %.

In one exemplary embodiment, as shown in FIG. 1, a microbolometer 100 is fabricating by sputter-depositing a vanadium oxide ($VO_x$) thin film (thermistor) 101 on a silicon (Si) substrate coated with a thin (~1 micron) film 102 of an appropriate material, such as silicon nitride ($Si_3N_4$) or silicon oxide ($SiO_x$) (i.e., electrically insulating), inside an ultrahigh vacuum (i.e., base pressure~$8 \times 10-10$ Torr), load-locked, magnetron or radio frequency (RF) sputtering deposition system. The RF magnetron reactive ion sputtering system deposits the vanadium oxide ($VO_x$) 101 onto the heated silicon substrate, which enables a wider range of materials to be fabricated than when using other methods, such as ion beam sputtering.

In one exemplary embodiment, the $VO_x$ composition deposition is varied by changing the oxygen partial pressure inside the deposition chamber, and its microstructure is varied by: (1) applying a reverse bias during deposition, (2) heating the substrate during deposition, and/or (3) heating the substrate post-deposition in an oxygen-rich environment. Deposition with higher oxygen partial pressure resulted in insulating films, whereas the deposition with low oxygen partial pressure and moderate reverse bias etching resulted in semi-metallic films (at room temperature).

In one exemplary embodiment, the VOx thin film 101 with the highest temperature coefficient of resistance (TCR) was used to fabricate the microbolometer 100. The silicon nitride or silicon dioxide coated VOx thin film 101 may be coated with a thin, thermally conductive film 103 (e.g., amorphous silicon, diamond-like carbon, or graphene).

In one exemplary embodiment, titanium/gold (Ti/Au) bias leads 104 and bond pads are electron beam sputter-deposited on the $VO_x$ thermistor 101, and patterned with a photo-resist lift-off mask. In one exemplary embodiment, the silicon substrate or wafer was thinned from the reverse/back side using a deep reactive ion etcher, after which the mask is lifted (or thermally evaporated), and the silicon nitride thermal isolation legs (support structure) were defined (see cut-out of silicon nitride membrane 105) by etching the $VO_x$ 101. This provides good thermal isolation between the silicon nitride 102 and the silicon substrate.

In one exemplary embodiment, the etching of the thermal isolation structures can be performed from the front by a reactive ion process, and then the silicon can be etched from the back of the substrate.

In one exemplary embodiment, mechanical models, which included targeted low stress silicon nitride membranes 102 (e.g., up to 1.4 mm on a side) thermally isolated by silicon nitride thermal isolation legs (e.g., 5 micron thick×100 micron long), were fabricated. However, one of ordinary skill in the art would know that the actual structures realized may vary.

In one exemplary embodiment, the fabrication process developed resulted in 100% yield using either 200 nm or 465 nm 101 membranes.

The leg-isolated silicon nitride membrane fabrication process of the present invention was shown to fabricate ultrasensitive microbolometers. Consequently, apart from the high TCR vanadium dioxide thin films, ultrasensitive uncooled bolometers were realized. Furthermore, mechanical models developed using a similar fabrication process have been demonstrated for ultra-thin silicon membranes, which is necessary for the realization of doped silicon thermopiles. By changing the oxygen partial pressure, reverse bias, substrate temperature, and post-deposition annealing parameters, the film properties of the present bolometers, could be engineered.

Uncooled microbolometers containing the coating of the present invention on the sensing element, can be used in a variety of commercial applications, which include surveillance, automotive night vision, sorting applications, solar cell inspection, soldering and welding, and other industrial inspection applications.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A method of fabricating a bolomoter, comprising:
sputter-depositing a vanadium oxide film on a silicon substrate inside a deposition chamber;
wherein a composition of said vanadium oxide film is varied by changing an oxygen partial pressure inside said deposition chamber; and
increasing a temperature coefficient of resistance (TCR) of said vanadium oxide film to above 6.5/K % by varying a microstructure of said vanadium oxide film by applying a reverse bias during deposition, heating said silicon substrate during deposition, and heating said silicon substrate post-deposition in an oxygen-rich environment.

2. The method of claim 1, wherein said silicon substrate is coated with one of a film of silicon nitride or silicon dioxide.

3. The method of claim 2, wherein said sputter deposition is carried out inside said deposition chamber of one of an ultrahigh vacuum, magnetron or radio frequency (RF) sputtering deposition system.

4. The method of claim 2, further comprising:
reducing an internal thermal time constant by depositing a thermally conductive film on said silicon nitride or silicon dioxide coated vanadium oxide film with of one of amorphous silicon, graphene, or diamond-like carbon.

5. The method of claim 4, further comprising:
sputter-depositing a plurality of titanium/gold bias leads and bond pads on said vanadium oxide thin film;
patterning said plurality of titanium/gold bias leads and bond pads using a lift-off photo-resist mask; and
etching a plurality of silicon nitride thermal isolation legs in said vanadium oxide film and said silicon substrate.

6. The method of claim 5, further comprising:
thinning said silicon substrate from a back side of said substrate using a deep reactive ion etcher, after which said photo-resist mask is dissolved.

7. The method of claim 5, wherein etching of said thermal isolation legs is performed from a front of said silicon substrate, using a reactive ion etch process.

8. The method of claim 1, wherein said vanadium oxide film is a sensing element of the bolometer, and is used in thermal imaging applications over the 8-14 micron spectral band.

9. A bolomoter, comprising:
a vanadium oxide film sputter-deposited on a silicon substrate inside a deposition chamber;
wherein a composition of said vanadium oxide film is varied by changing an oxygen partial pressure inside said deposition chamber; and
wherein a microstructure of said vanadium oxide film is varied by at least one of applying a reverse bias during deposition, and heating said silicon substrate during deposition, and/or heating said silicon substrate post-deposition in an oxygen-rich environment;
wherein a change in said microstructure increases a temperature coefficient of resistance (TCR) of said vanadium oxide film; and
further wherein said vanadium oxide film has a temperature coefficient of resistance (TCR) exceeding 6.5/K %.

10. The bolometer of claim 9, wherein said silicon substrate is coated with one of a film of silicon nitride or silicon dioxide.

11. The bolometer of claim 10, wherein said sputter deposition is carried out inside said deposition chamber of one of an ultrahigh vacuum, magnetron or radio frequency (RF) sputtering deposition system.

12. The bolometer of claim 9, wherein an internal thermal time constant is reduced by depositing a thermally conductive film on said silicon nitride or silicon dioxide coated vanadium oxide film with of one of amorphous silicon, graphene, or diamond-like carbon.

13. The bolometer of claim 9, further comprising:
a plurality of titanium/gold bias leads and bond pads deposited on said vanadium oxide thin film; and
a plurality of silicon nitride thermal isolation legs etched in said vanadium oxide film and said silicon substrate;
wherein said plurality of titanium/gold bias leads and bond pads are patterned using a lift-off photo-resist mask.

14. The bolometer of claim 13, wherein said silicon substrate is thinned from a back side of said substrate using a deep reactive ion etcher, after which said photo-resist mask is dissolved.

15. The bolometer of claim 9, wherein etching of said thermal isolation legs is performed from a front of said silicon substrate, using a reactive ion etch process.

16. The bolometer of claim 9, wherein said vanadium oxide film is a sensing element of the bolometer, and is used in thermal imaging applications over the 8-14 micron spectral band.

* * * * *